United States Patent
Luo

(10) Patent No.: US 11,793,018 B2
(45) Date of Patent: Oct. 17, 2023

(54) OLED PACKAGING STRUCTURE AND PACKAGING METHOD, AND DISPLAY APPARATUS

(71) Applicant: BOE Technology Group Co., Ltd., Beijing (CN)

(72) Inventor: Chengyuan Luo, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 331 days.

(21) Appl. No.: 17/271,579

(22) PCT Filed: May 20, 2020

(86) PCT No.: PCT/CN2020/091380
§ 371 (c)(1),
(2) Date: Feb. 25, 2021

(87) PCT Pub. No.: WO2020/248786
PCT Pub. Date: Dec. 17, 2020

(65) Prior Publication Data
US 2021/0351372 A1    Nov. 11, 2021

(30) Foreign Application Priority Data
Jun. 14, 2019  (CN) .......................... 201910516258.X

(51) Int. Cl.
*H01L 51/52* (2006.01)
*H01L 51/56* (2006.01)
(Continued)

(52) U.S. Cl.
CPC ....... *H10K 50/8428* (2023.02); *H10K 50/841* (2023.02); *H10K 50/8426* (2023.02); *H10K 71/00* (2023.02); *H10K 2102/351* (2023.02)

(58) Field of Classification Search
CPC ............. H10K 50/841; H10K 50/8426; H10K 50/8428
See application file for complete search history.

(56) References Cited

U.S. PATENT DOCUMENTS

| | | | |
|---|---|---|---|
| 2004/0150319 A1 | 8/2004 | Tomimatsu et al. | |
| 2005/0140291 A1* | 6/2005 | Hirakata | H01L 33/52 313/506 |

(Continued)

FOREIGN PATENT DOCUMENTS

| | | | |
|---|---|---|---|
| CN | 1498517 A | 5/2004 | |
| CN | 1557028 A | 12/2004 | |

(Continued)

OTHER PUBLICATIONS

Machine translation, Choi, Chinese Pat. Pub. No. CN101009312A, translation date: Mar. 14, 2023, Espacenet, all pages. (Year: 2023).*

(Continued)

*Primary Examiner* — Victoria K. Hall
(74) *Attorney, Agent, or Firm* — IPRO, PLLC

(57) ABSTRACT

Disclosed in embodiments of the present disclosure are an OLED packaging structure and packaging method, and a display apparatus. The purpose that the packaging structure does not influence the display performance of an OLED device, while ensuring a uniform cell gap between a display substrate and a packaging cover plate is achieved. The main technical solution of the present disclosure is: a packaging cover plate, wherein a sealant layer is arranged on the edge of a first surface of the packaging cover plate opposite to a display substrate in an annular configuration, a region encircled by the sealant layer is filled with a filling adhesive layer, a plurality of support blocks having preset flexibility are distributed in a region corresponding to the sealant layer, and the thickness of the support block is equal to a preset (Continued)

distance between the packaging cover plate and the display substrate.

17 Claims, 4 Drawing Sheets

(51) Int. Cl.
    *H10K 50/842*     (2023.01)
    *H10K 71/00*     (2023.01)
    *H10K 50/84*     (2023.01)
    *H10K 102/00*     (2023.01)

(56) References Cited

U.S. PATENT DOCUMENTS

| | | | |
|---|---|---|---|
| 2007/0120478 A1* | 5/2007 | Lee | H10K 59/90 313/511 |
| 2010/0244057 A1* | 9/2010 | Ryu | H10K 50/8426 257/40 |
| 2010/0258346 A1 | 10/2010 | Chen et al. | |
| 2011/0152435 A1 | 6/2011 | Morishita et al. | |
| 2011/0240966 A1 | 10/2011 | Lees et al. | |
| 2011/0242792 A1 | 10/2011 | Choi | |
| 2012/0080671 A1* | 4/2012 | Niboshi | H10K 50/844 438/26 |
| 2015/0263310 A1 | 9/2015 | Gong | |
| 2016/0013440 A1 | 1/2016 | Luo et al. | |
| 2016/0251551 A1 | 9/2016 | Wang et al. | |

FOREIGN PATENT DOCUMENTS

| | | | | |
|---|---|---|---|---|
| CN | 101009312 A | * | 8/2007 | ......... H10K 50/8426 |
| CN | 102132440 A | | 7/2011 | |
| CN | 102159639 A | | 8/2011 | |
| CN | 103309092 A | * | 9/2013 | ........... G02F 1/1339 |
| CN | 103309092 A | | 9/2013 | |
| CN | 103436203 A | | 12/2013 | |
| CN | 104241547 A | | 12/2014 | |
| CN | 104393186 A | * | 3/2015 | ............. H10K 30/80 |
| CN | 104393186 A | | 3/2015 | |
| CN | 105895825 A | * | 8/2016 | ......... H10K 50/8426 |
| CN | 105895825 A | | 8/2016 | |
| CN | 106910840 A | * | 6/2017 | ........... H10K 50/841 |
| CN | 106910840 A | | 6/2017 | |
| CN | 107359270 A | * | 11/2017 | |
| CN | 107359270 A | | 11/2017 | |
| CN | 109546003 A | * | 3/2019 | ............. H10K 50/84 |
| CN | 109546003 A | | 3/2019 | |
| CN | 110112323 A | | 8/2019 | |
| JP | 2011-233341 A | * | 11/2011 | ......... H10K 50/8428 |
| JP | 2011233341 A | | 11/2011 | |
| WO | 03030272 A2 | | 4/2003 | |

OTHER PUBLICATIONS

Machine translation, Liu, Chinese Pat. Pub. No. CN105895825A, translation date: Feb. 22, 2023, Espacenet, all pages. (Year: 2023).*
Machine translation, Liu, Chinese Pat. Pub. No. CN109546003A, translation date: Feb. 22, 2023, Espacenet, all pages. (Year: 2023).*
Machine translation, Sakaguchi, Japanese Pat. Pub. No. JP2011233341A, translation date: Feb. 22, 2023, Espacenet, all pages. (Year: 2023).*
Machine translation, Bai, Chinese Pat. Pub. No. CN107359270A, translation date: Feb. 22, 2023, Espacenet, all pages. (Year: 2023).*
Machine translation, Hou, Chinese Pat. Pub. No. CN106910840, translation date: Feb. 22, 2023, Espacenet, all pages. (Year: 2023).*
Machine translation, Jing, Chinese Pat. Pub. No. CN103309092, translation date: Feb. 22, 2023, Espacenet, all pages. (Year: 2023).*
Machine translation, Wang, Chinese Pat. Pub. No. CN104393186A, translation date: Feb. 22, 2023, Espacenet, all pages. (Year: 2023).*
International Searching Authority, Translation, Written Opinion of the International Searching Authority, International application No. PCT/CN2020/091380, dated Aug. 24, 2020, all pages. (Year: 2020).*
International Searching Authority, Translation, International Search Report, International application No. PCT/CN2020/091380, dated Aug. 24, 2020, all pages. (Year: 2020).*
State Intellectual Property Office, People's Republic of China, App. No. CN201910516258.X First Office Action dated Nov. 25, 2020.
State Intellectual Property Office, People's Republic of China, App. No. CN201910516258.X Second Office Action dated Jun. 8, 2021.

* cited by examiner

OLED PACKAGING STRUCTURE AND PACKAGING METHOD, AND DISPLAY APPARATUS

CROSS REFERENCES TO RELATED APPLICATION

The present disclosure is a National Stage of International Application No. PCT/CN2020/091380, filed May 20, 2020, which claims the priority from Chinese Patent Application No. 201910516258.X, filed with the China National Intellectual Property Administration on Jun. 14, 2019 and entitled "OLED Packaging Structure and Method, and Display Apparatus", the entire content of which is hereby incorporated by reference.

FIELD

The present disclosure relates to the technical field of display, and particularly to an OLED packaging structure and method, and a display apparatus.

BACKGROUND

The Organic Light-Emitting Diode (OLED) is a display lighting technology that has gradually developed in recent years, especially in the display industry. Because of its high response, high contrast, and flexibility, the OLED is considered to have wide application prospects. However, because OLED devices are subject to corrosion damage under the action of water vapor and oxygen, it is particularly important for OLED devices to choose a better packaging method.

SUMMARY

Embodiments of the present disclosure provide an OLED packaging structure configured to package an OLED device on a display substrate, including:
  a packaging cover plate, provided with a first surface opposite to the display substrate;
  a sealant layer, disposed on the first surface and located around edges of the first surface;
  a filling adhesive layer, filled in an area defined by the sealant layer; and
  a plurality of support blocks, distributed in an area where the sealant layer is located and provided with a preset flexibility, the support blocks are configured to fix a cell thickness between the packaging cover plate and the display substrate.

In some embodiments, a main material of the support blocks is the same as a main material of the sealant layer; the main material of the support blocks is doped with a reinforcing material, and the reinforcing material is configured to enhance strength of the support blocks.

In some embodiments, the reinforcing material is a nanowire.

In some embodiments, a volume ratio of the nanowire in the support blocks is 10%-50%.

In some embodiments, surfaces of the support blocks in contact with the display substrate are planes.

In some embodiments, a width of the sealant layer is greater than a width of the support blocks in the area where the sealant layer is located.

In some embodiments, each edge of the first surface of the packaging cover plate is provided with at least one support block.

In some embodiments, each edge of the first surface of the packaging cover plate is provided with the plurality of support blocks.

In some embodiments, a material of the sealant layer is an ultraviolet curable resin adhesive or a thermosetting resin adhesive;
  a viscosity of the sealant layer is between 100000 mPa·s and 400000 mPa·s.

In some embodiments, a material of the filling adhesive layer is an ultraviolet curable resin adhesive or a thermosetting resin adhesive;
  a viscosity of the filling adhesive layer is between 100 mPa·s and 2000 mPa·s.

On the other hand, embodiments of the present disclosure further provide an OLED packaging method, including:
  making a plurality of support blocks, and arranging the plurality of support blocks in an area where a sealant layer is to be formed on edges of a first surface of a packaging cover plate;
  coating the sealant layer around the edges of the first surface of the packaging cover plate;
  coating a filling adhesive layer in an area defined by the sealant layer; and
  pressing the packaging cover plate and a surface of a display substrate provided with an OLED device together, and curing the sealant layer and the filling adhesive layer.

In some embodiments, the making the plurality of support blocks includes:
  doping nanowires in sealant;
  curing the sealant doped with the nanowires; and
  cutting the sealant doped with the nanowires into the support blocks with a preset thickness.

On the other hand, embodiments of the present disclosure further provide a display apparatus, including: the above-mentioned OLED packaging structure provided by embodiments of the present disclosure, and the display substrate with the OLED device.

DETAILED DESCRIPTION OF THE EMBODIMENTS

Currently commonly used OLED packaging methods include film packaging, fit packaging, and dam-fill packaging. Among them, the dam-fill packaging, i.e., a packaging method where a sealant layer (dam) and a filling adhesive layer (fill) are used together to package a device, is very popular because of its characteristics such as good water and oxygen barrier effect, simple production process, and application in large-size device packaging.

Figure 1:
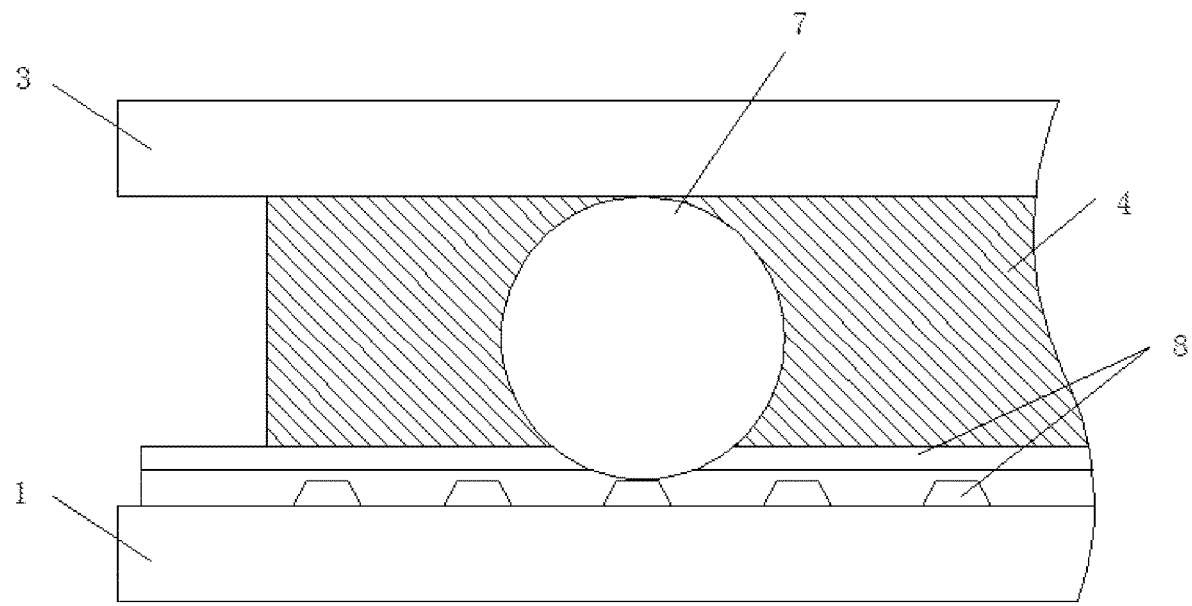
FIG. 1 is a schematic structural diagram of an OLED packaging structure in the related art.

As shown in FIG. 1, in the packaging structure using the sealant layer (dam) and the filling adhesive layer (fill), in order to fix the thickness of the cell, a spherical spacer 7 is usually added to the sealant layer 4. In the process of packaging and pressing, the spherical spacer 7 plays a role of supporting a display substrate 1 and a packaging cover plate 3, which can prevent the degree of edge pressing from being inconsistent, causing the problem of uneven cell thickness. However, since the material of the spherical spacer 7 is mostly hard silicon or silicide, it is easy to damage exposed metal wires 8 on the display substrate 1 during the packaging and pressing process, especially the portion of the metal wires 8 overlapping up and down, or the electrical properties will be affected after contact with the electrodes, which will cause the device to produce dark lines and other undesirable phenomena and thus affects the production yield.

In order to make the objectives, technical solutions and advantages of the present disclosure clearer, embodiments of the OLED packaging structure, packaging method, and display apparatus provided by the present disclosure will be described in detail below with reference to the accompanying drawings. It should be understood that the preferred embodiments described below are only used to illustrate and explain the present disclosure, and are not used to limit the present disclosure. Moreover, in the case of no conflict, embodiments in the present disclosure and the features in embodiments can be combined with each other.

The shapes and sizes of the components in the drawings do not reflect the true proportions, and are only intended to illustrate the present disclosure.

Figure 2:
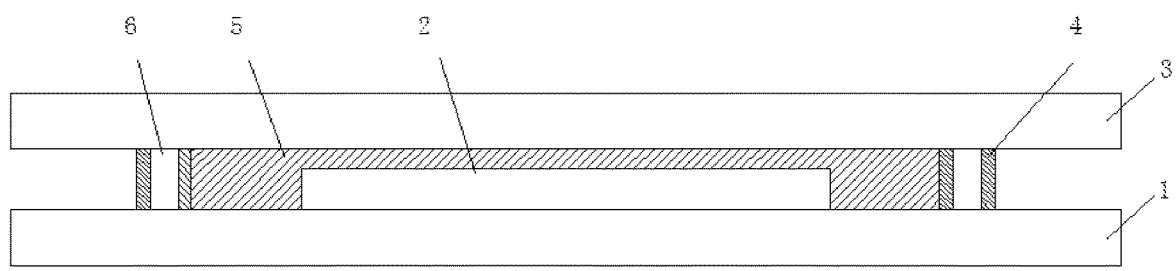
FIG. 2 is a schematic structural diagram of an OLED packaging structure provided by an embodiment of the present disclosure.
Figure 3:
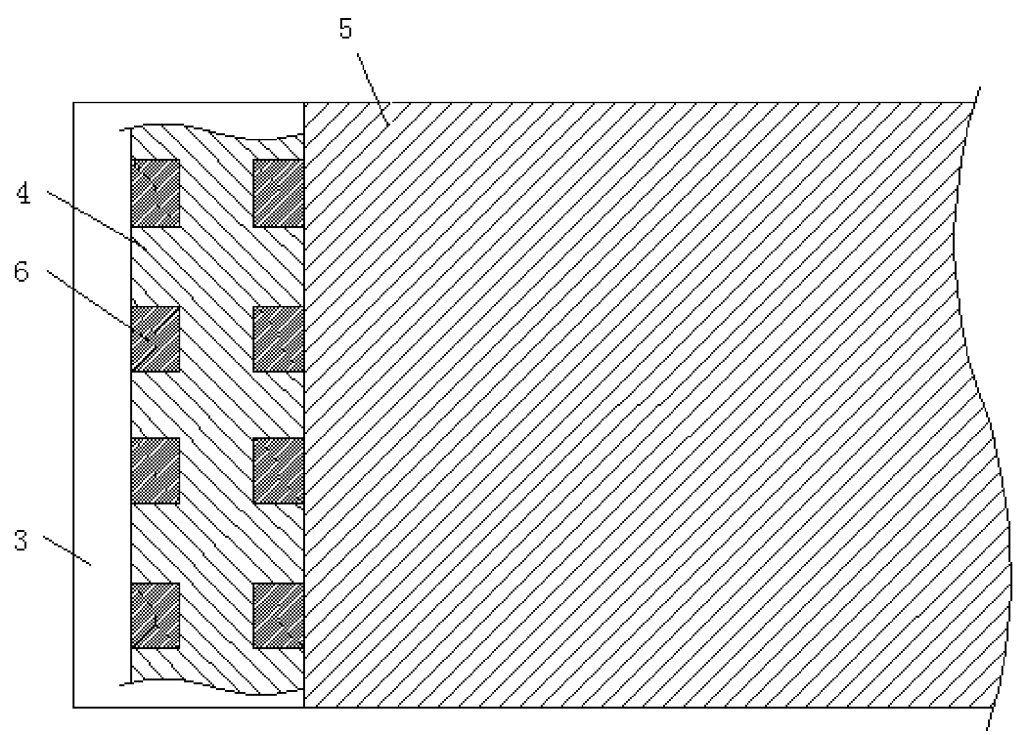
FIG. 3 is a schematic structural diagram of a support block in an OLED packaging structure provided by an embodiment of the present disclosure.
Figure 4:
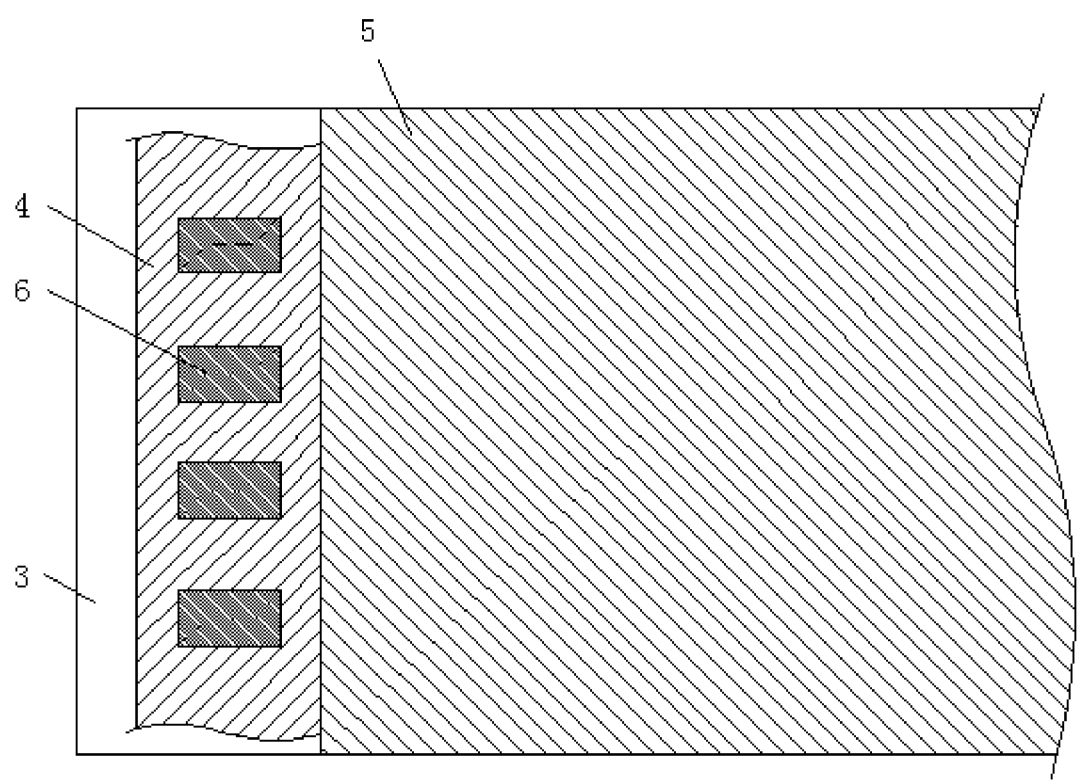
FIG. 4 is another schematic structural diagram of a support block in an OLED packaging structure provided by an embodiment of the present disclosure.

As shown in FIGS. 2 to 4, an OLED packaging structure provided by embodiments of the present disclosure is configured to package an OLED device 2 on a display substrate 1. The OLED packaging structure includes:

a packaging cover plate 3, a sealant layer 4 located around edges of a first surface of the packaging cover plate 3 opposite to the display substrate 1, and a filling adhesive layer 5 filled in an area defined by the sealant layer 4;

a plurality of support blocks 6 with a preset flexibility are distributed in the area where the sealant layer 4 is located, and the support blocks are configured to fix a cell thickness between the packaging cover plate 3 and the display substrate 1.

In some embodiments, when the packaging cover plate 3 is used to package the display substrate 1 with the OLED device 2, the packaging cover plate 3 is disposed on an upper side of the display substrate 1, and the OLED device 2 is disposed on a surface of the display substrate 1 opposite to the packaging cover plate 3. The size of the packaging cover plate 3 can be adapted to the size of the display substrate 1. The material of the packaging cover plate 3 can be glass, quartz, plastic, etc. The sealant layer 4 and the filling adhesive layer 5 are configured to connect the packaging cover plate 3 and the display substrate 1 to package the OLED device 2 on the display substrate 1, thus avoiding corrosion and damage of the OLED device 2 caused by contact with external water vapor.

In some embodiments, the sealant layer 4 is formed by coating a sealant on preset positions around the edges of the packaging cover plate 3. The preset positions may correspond to a non-display area of the display substrate 1, and the filling adhesive layer 5 is formed by coating filling adhesive in the area defined by the sealant layer 4.

In some embodiments, after the sealant layer 4 and the filling adhesive layer 5 are coated, in the process of pressing the packaging cover plate 3 and the display substrate 1, it is easy to cause uneven cell thickness between the packaging cover plate 3 and the display substrate 1; and especially for a large-size display substrate, uneven cell thickness is more likely to occur when the packaging cover plate 3 and the display substrate 1 are pressed together. The uneven cell thickness between the packaging cover plate 3 and the display substrate 1 will affect the display performance of a display panel. The even cell thickness between the packaging cover plate 3 and the display substrate 1 is especially important for the top-emitting OLED. If the cell thickness between the packaging cover plate 3 and the display substrate 1 is uneven, the display distortion caused by the optical path difference will occur, and if the packaging cover plate 3 is equipped with a color film, the uneven cell thickness between the packaging cover plate 3 and the display substrate 1 can also cause lateral light leakage.

Based on this, in the above-mentioned OLED packaging structure provided by embodiments of the present disclosure, support blocks 6 for fixing the cell thickness between the packaging cover plate 3 and the display substrate 1 are adopted. In some embodiments, the support blocks 6 are provided with a preset thickness, and the preset thickness is equal to a preset distance between the display substrate 1 and the packaging cover plate 3, that is, the thickness of the support blocks 6 is equal to the cell thickness between the display substrate 1 and the packaging cover plate 3. The support blocks 6 are distributed in the area where the sealant layer 4 is located, which can prevent the position of the support blocks 6 from being disturbed by the OLED device 2 on the display substrate 1 when the support blocks 6 are disposed in the area where the filling adhesive layer 5 is located. When the display substrate 1 and the packaging cover plate 3 are fit together, the support blocks 6 can play a supporting role between the display substrate 1 and the packaging cover plate 3, so that the cell thickness between the display substrate 1 and the packaging cover plate 3 can be fixed, thus ensuring the even cell thickness between the display substrate 1 and the packaging cover plate 3.

Moreover, the support blocks 6 are provided with a preset flexibility. The preset flexibility here can be set so that when the display substrate 1 and the packaging cover plate 3 are pressed together, excessive pressure will not be generated on the display substrate 1, so as to prevent the support structure with excessive hardness from excessively squeezing the exposed metal wires 8 on the display substrate 1, especially at the positions where the metal wires 8 overlap up and down (the metal wires 8 are spaced by an insulating material). In this way, the metal wires 8 to be crushed is avoided, or the electrical properties being affected after contact with the electrodes is avoided, and the phenomenon of dark lines appearing in the display device is avoided. Therefore, the support blocks 6 with a preset flexibility are provided to protect the display substrate 1 while fixing the thickness of the cell between the display substrate 1 and the packaging cover plate 3, so as to improve the yield of the display device.

In addition, the support blocks 6 should not have too much flexibility. If the flexibility of the support block 6 is too much, the support blocks 6 will deform when the display substrate 1 and the packaging cover plate 3 are pressed together, the distance between the display substrate 1 and the packaging cover plate 3 cannot be fixed, and thus the effect of even cell thickness cannot be achieved.

Therefore, in the above-mentioned packaging structure provided by embodiments of the present disclosure, during the process of making the support blocks 6, a material with a certain degree of flexibility can be used, and a reinforcing material can be added to the material to make the support blocks 6; or the support blocks 6 can also be made of a material with moderate flexibility and hardness, so as to achieve an even cell thickness between the display substrate 1 and the packaging cover plate 3 without excessive pressure and damage to the display substrate 1. Further, in addition to the flexibility of the material that should be considered during the selection of the material of the support blocks 6, whether the material will affect the sealing performance of the sealant layer 4 should also be considered, and the material which does not affect the sealing performance of the sealant layer 4 should be selected.

In some embodiments, in order to achieve the effect of even cell thickness between the display substrate 1 and the packaging cover plate 3, in the above-mentioned packaging structure provided by embodiments of the present disclosure, a plurality of support blocks 6 are disposed on the edges of the first surface of the packaging cover plate 1 and in the area where the sealant layer 4 is located. In some embodiments, each edge of the first surface of the packaging cover plate 3 is provided with at least one support block 6. Further, in the above-mentioned packaging structure provided by embodiments of the present disclosure, a plurality of support blocks 6 may be uniformly disposed on each edge of the first surface of the packaging cover plate 3.

In some embodiments, in the above-mentioned packaging structure provided by embodiments of the present disclosure, the shape of the support blocks 6 may be set to various shapes such as a cube and a cuboid.

Optionally, in the above-mentioned packaging structure provided by embodiments of the present disclosure, the surfaces of the support blocks 6 in contact with the display substrate 1 may be set to be planes. Compared with the existing method where the spherical spacer 7 is used as a support structure, setting the surface of the support structure in contact with the display substrate 1 as a plane can increase the contact area between the support structure and the surface of the display substrate 1, thereby avoiding excessive pressure on a part of display substrate 1 and preventing damage to the OLED device 2.

In some embodiments, in the above-mentioned packaging structure provided by embodiments of the present disclosure, the height of the support blocks 6 is equal to the cell thickness between the display substrate 1 and the packaging cover plate 3, and the length and width of the support blocks 6 can be set according to actual conditions. For example, the width of the support blocks 6 can be smaller than the width of the sealant layer 4 on each edge, so that the contact area between the sealant layer 4 and the packaging cover plate 3, and the contact area between the sealant layer 4 and the display substrate 1 can be increased to improve the packaging effect.

In the OLED packaging structure provided by embodiments of the present disclosure, the packaging cover plate 3 is bonded to the display substrate 1 through the sealant layer 4 and the filling adhesive layer 5 to realize the packaging process. By providing a plurality of support blocks 6 in the area on the edges of the packaging cover plate 3 corresponding to the sealant layer 4, the cell thickness between the display substrate 1 and the packaging cover plate 3 can be fixed during the pressing process of the packaging cover plate 3 and the display substrate 1, the even cell thickness between the display substrate 1 and the packaging cover plate 3 can be ensured, and especially for large-size display panels, the effect is more obvious. Since the support blocks 6 are provided with a preset flexibility, excessive pressure will not be generated on the display substrate 1 during the pressing process of the packaging cover plate 3 and the display substrate 1, which can prevent the exposed wires from being crushed or affecting electrical properties after contact with electrodes. It can play a role in improving the display image quality of the display panel and improving the yield rate and competitiveness.

Optionally, in the above-mentioned packaging structure provided by embodiments of the present disclosure, the material of the support blocks 6 has a variety of different options. For example, the main material of the support blocks 6 can be the same as the main material of the sealant layer 4. The main material of the support blocks 6 should be selected to ensure that the support blocks 6 will not affect the packaging effect and the water vapor blocking effect, thus preventing the damage to the OLED device 2 caused by the entrance of water vapor due to the arrangement of the support blocks 6. In some embodiments, the sealant used to make the sealant layer 4 can be used to make the support blocks 6. On one hand, the sealant has a good performance in blocking water vapor, and the cured sealant has a low hardness, which can meet the requirement of a preset flexibility. On the other hand, it can facilitate the production of the support blocks 6 and avoids the preparation process of other materials. The direct use of the sealant can improve the efficiency and reduce the cost of packaging.

Since the cured support blocks 6 made of the sealant will still be deformed after being stressed, the pressing of the packaging cover plate 1 and the display substrate 3 is likely to cause deformation of the support blocks 6, which cannot provide an effective supporting effect and can not fix the cell thickness between the display substrate 1 and the packaging cover plate 3. Therefore, a reinforcing material can be doped in the main material of the support blocks 6, and the reinforcing material is configured to enhance the strength of the support blocks 6. After the strengthening material is doped, the strength of the support blocks 6 can be strengthened, and the packaging cover plate 3 and the display substrate 1 can be effectively supported and fixed, thus preventing the change in the cell thickness between the display substrate 1 and the packaging cover plate 3 during the pressing process.

In some embodiments, the above-mentioned reinforcing material can be arranged in many different ways. The reinforcing material can be a nanowire, and the nanowire can be defined as a one-dimensional structure that is limited to 100 nanometers or below in the lateral direction, and there is no restriction in its longitudinal direction. The material of the nanowire used here can be inorganic materials such as C, ZnS, ZnO, TiO2, etc, with a diameter ranging from 10 nm to 50 nm and a length ranging from 10 μm to 500 μm. As the size decreases, the nanowire will exhibit better mechanical properties than ordinary bulk materials, and its strength will become stronger and its toughness will become better. Adding nanowires to the support blocks 6 can increase the strength of the support blocks 6 and reduce the deformation of the support blocks 6 due to the stress, so as to ensure that the support blocks 6 have a good supporting performance when the packaging cover plate 3 and the display substrate 1 are pressed together, and can fix the cell thickness between the display substrate 1 and the packaging cover plate 3 during the sealing process, thus achieving even thickness and further ensuring the use performance of the OLED display device.

In some embodiments, by limiting the overall proportion of the nanowires in the support blocks 6, the hardness of the support blocks 6 after the nanowires are added can be controlled to prevent the hardness of the support blocks 6 from affecting the display function of the display substrate 1. Optionally, in the above-mentioned packaging structure provided by embodiments of the present disclosure, the volume ratio of the nanowires in the support blocks 6 is 10%-50%.

In the above-mentioned packaging structure provided by embodiments of the present disclosure, the shape of the support blocks 6 can be set in many different specific ways. In the related art, a spherical spacer 7 is used to be arranged between the display substrate 1 and the packaging cover plate 3, as shown in FIG. 1; it plays a supporting role in the pressing process of the display substrate 1 and the packaging cover plate 3. The spherical spacer 7 is a sphere. The arrangement of the sphere can easily lead to unstable support, and its contacts with the display substrate 1 and the packaging cover plate 3 are all point contacts, and the contact area is small, which causes the pressure generated during the pressing to concentrate on the part of the display substrate 1; and the locally excessive pressure may cause crush damage to the metal wires 8 of the display substrate 1 or other devices. Based on this, as shown in FIG. 2, the surfaces of the support blocks 6 in contact with the display substrate 1 can be planes and the support blocks are in contact with the display substrate 1 by the planes; under the same pressure, the contact area increases, and the pressure received by the display substrate 1 decreases, that is, the effect of the pressure on the display substrate 1 can be reduced. The shape of the support blocks 6 can also be arranged in various forms. The surfaces of the support blocks 6 in contact with the display substrate 1 are third surfaces; the surfaces opposite to the third surfaces and in contact with the packaging covers 3 are second surfaces, and the second surfaces can be set as planes. The support blocks 6 are in plane contact with both the display substrate 1 and the packaging cover plate 3, which can improve the stability of the support for the display substrate 1 and the packaging cover plate 3. Under this premise, the support blocks 6 can be set as cylinders, cubes, cuboids, etc., which is not limited here.

Optionally, in the above-mentioned packaging structure provided by embodiments of the present disclosure, the material of the sealant layer 4 can be ultraviolet curable resin adhesive or thermosetting resin adhesive, which has hydrophobic properties, and can be: epoxy resin, glycidyl acrylate, glycidyl methacrylate, methyl methacrylate, ethyl methacrylate, n-butyl methacrylate, 6,7-epoxyheptyl methacrylate, homopolymer or copolymer of monomers such as 2-hydroxyethyl methacrylate, melamine formaldehyde resin, unsaturated polyester resin, organic silicon resin, furan resin, etc. In addition, the viscosity of the sealant layer 4 may range from 100,000 mPa·s to 400,000 mPa·s.

Optionally, in the above-mentioned packaging structure provided by embodiments of the present disclosure, the material of the filling adhesive layer 5 can be ultraviolet curable resin adhesive or thermosetting resin adhesive, which has hydrophobic properties, and can be: epoxy resin, glycidyl acrylate, glycidyl methacrylate, methyl methacrylate, ethyl methacrylate, n-butyl methacrylate, 6,7-epoxyheptyl methacrylate, homopolymer or copolymer of monomers such as 2-hydroxyethyl methacrylate, melamine formaldehyde resin, unsaturated polyester resin, organic silicon resin, furan resin, etc. Moreover, the viscosity of the filling adhesive layer 5 may range from 100 mPa·s to 2000 mPa·s.

Figure 5:
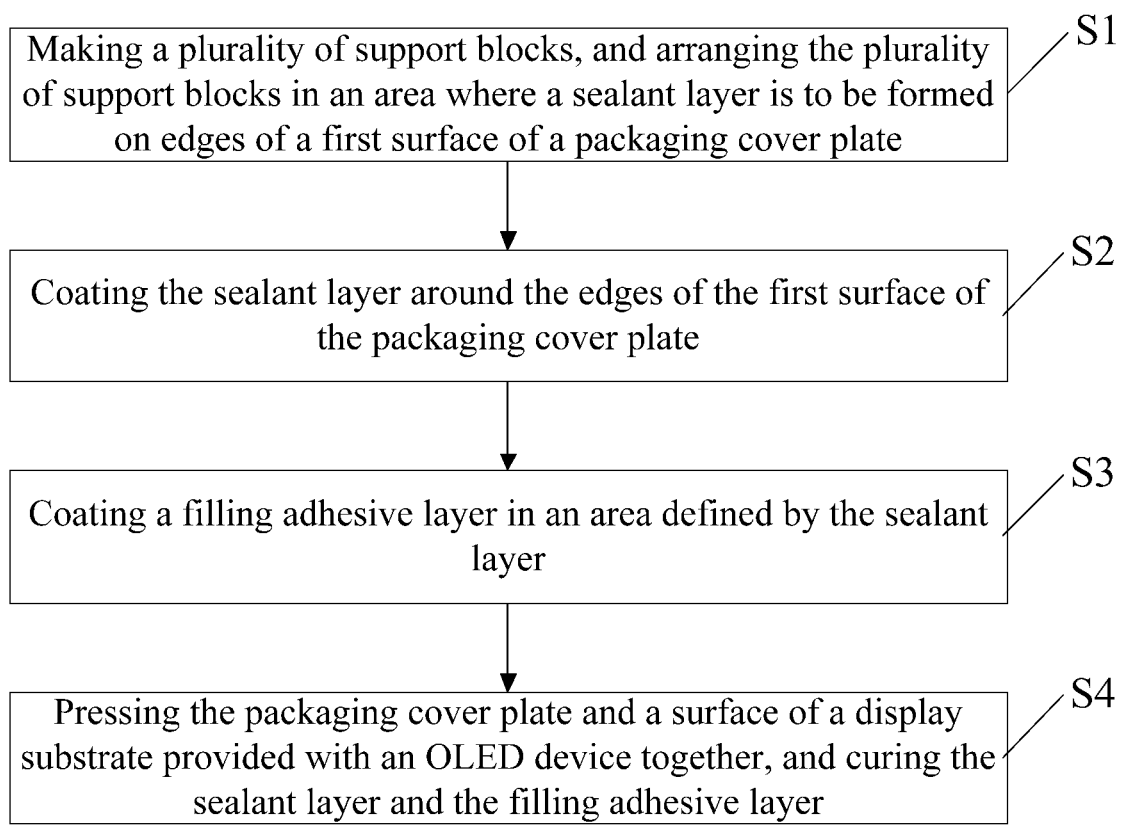
FIG. 5 is a flow diagram of a method for packaging an OLED provided by an embodiment of the present disclosure.

Based on the same inventive concept, embodiments of the present disclosure further provide an OLED packaging method. As shown in FIG. 5, the OLED packaging method includes:

S1: making a plurality of support blocks 6 and arranging the plurality of support blocks 6 in an area where a sealant layer is to be formed on the edges of a first surface of a packaging cover plate 3;

S2: coating the sealant layer 4 around the edges of the first surface of the packaging cover plate 3;

S3: coating a filling adhesive layer 5 in an area defined by the sealant layer 4; and S4: pressing the packaging cover plate 3 and a surface of the display substrate 1 provided with an OLED device together, and curing the sealant layer 4 and the filling adhesive layer 5.

In the OLED packaging method provided by embodiments of the present disclosure, by providing a plurality of support blocks 6 in the area on the edges of the packaging cover plate 3 corresponding to the sealant layer 4, the cell thickness between the display substrate 1 and the packaging cover plate 3 can be fixed during the pressing process of the packaging cover plate 3 and the display substrate 1, the even cell thickness between the display substrate 1 and the packaging cover plate 3 can be ensured, and especially for large-size display panels, the effect is more obvious. Since the support blocks 6 are provided with a preset flexibility, excessive pressure will not be generated on the display substrate during the pressing process of the packaging cover plate 3 and the display substrate 1, which can prevent the exposed wires from being crushed or affecting electrical properties after contact with electrodes. It can play a role in improving the display image quality of the display panel and improving the yield rate and competitiveness.

In some embodiments, the making the support blocks 6 may include: doping the nanowires in sealant and curing, and then cutting into the support blocks with a preset thickness.

In some embodiments, the support blocks 6 are provided with a preset flexibility and play a supporting role during the pressing process of the packaging cover plate 3 and the display substrate 1. The support blocks 6 can be made of sealant. In order to improve the hardness of the cured support blocks 6 and reduce the deformation after being stressed, nanowires can be added to the sealant to make the support blocks. As the size decreases, the nanowires will show better mechanical properties than ordinary bulk materials, and its strength will become stronger and its toughness will become better. Adding the nanowires to the support blocks can increase the strength of the support blocks. The nanowires can be made of inorganic materials such as C, ZnS, ZnO, TiO2, etc, with a diameter randing from 10 nm to 50 nm and a length ranging from 10 μm to 500 μm; in some embodiments, the volume ratio of the nanowire in the support blocks 6 can be 10%-50%.

In implementation, the above-mentioned nanowires are uniformly mixed in the sealant, and the mixture is irradiated with UV light to be cured, and then cut into support blocks with a preset thickness. For example, when the cell thickness between the packaging cover plate 3 and the display substrate 1 is 10 μm, the preset thickness of the support blocks 6 should be 10 μm, and the cured sealant is cut into multiple blocks with a thickness of 10 μm, and the size of each support block 6 can be the same. Further, the support blocks 6 can be cut into cuboid blocks, which can be implemented easily, can improve the production efficiency of the support blocks 6 and help improve the support stability of the support blocks 6. The width of the support blocks 6 can be smaller than the width of the corresponding sealant layer 4. For example, when the sealant layer 4 disposed on the edges of the first surface of the packaging cover plate 3 is 3 mm wide, as shown in FIG. 4, the length and width of the cuboid support blocks 6 can be set as 1 mm, and the spacing between the adjacent support blocks 6 is 1 mm; this not only ensures the support for the packaging cover plate 3 and the display substrate 1, but also ensures the sufficient coating area for the sealant layer 4 and improves the packaging reliability. Alternatively, as shown in FIG. 3, a plurality of support blocks 6 can also be arranged side by side at the same width position of the sealant layer 4. For example, when the sealant layer 4 disposed on the edges of the first surface of the packaging cover plate 3 is 3 mm wide, the length and width of the cuboid support blocks 6 can be set as 0.5 mm, and two support blocks 6 are arranged side by side at the same width position of the sealant layer 4, and the two support blocks 6 can be arranged at intervals.

Based on the same inventive concept, embodiments of the present disclosure further provide a display apparatus, including: the above-mentioned the OLED packaging structure and the display substrate with the OLED device.

In the display apparatus provided by embodiments of the present disclosure, by providing a plurality of support blocks in the area on the edges of the packaging cover plate corresponding to the sealant layer of the packaging structure, the cell thickness between the display substrate and the packaging cover plate can be fixed during the pressing process of the packaging cover plate and the display substrate, the even cell thickness between the display substrate and the packaging cover plate can be ensured, and especially for large-size display devices, the effect is more obvious. Since the support blocks are provided with a preset flexibility, excessive pressure will not be generated on the display substrate during the pressing process of the packaging cover plate and the display substrate, which can prevent the exposed wires from being crushed or affecting electrical properties after contact with electrodes. It can play a role in improving the display image quality of the display device and improving the yield rate and competitiveness of the display device.

The above are only specific implementations of the present disclosure, but the protection scope of the present disclosure is not limited to this. Any changes or substitutions reached easily by those skilled in the art within the technical scope disclosed in the present disclosure shall fall within the scope of the present disclosure. Therefore, the scope of the present disclosure should be defined by the scope of the appended claims.

What is claimed is:

1. An OLED packaging structure, configured to package an OLED device on a display substrate, comprising:
    a packaging cover plate, provided with a first surface opposite to the display substrate;
    a sealant layer, disposed on the first surface and located around edges of the first surface;
    a filling adhesive layer, filled in an area defined by the sealant layer; and
    a plurality of support blocks, distributed in an area where the sealant layer is located, wherein the support blocks are flexible support blocks, and configured to fix a cell thickness between the packaging cover plate and the display substrate;
    wherein a main material of the support blocks is same as a main material of the sealant layer;
    the main material of the support blocks is doped with a reinforcing material, and the reinforcing material is configured to enhance strength of the support blocks.

2. The OLED packaging structure according to claim 1, wherein the reinforcing material is a nanowire.

3. The OLED packaging structure according to claim 2, wherein a volume ratio of the nanowire in the support blocks is 10%-50%.

4. The OLED packaging structure according to claim 1, wherein surfaces of the support blocks in contact with the display substrate are planes.

5. The OLED packaging structure according to claim 1, wherein a width of the sealant layer is greater than a width of the support blocks in the area where the sealant layer is located.

6. The OLED packaging structure according to claim 5, wherein each edge of the first surface of the packaging cover plate is uniformly provided with the plurality of support blocks.

7. The OLED packaging structure according to claim 1, wherein each edge of the first surface of the packaging cover plate is provided with at least one support block.

8. The OLED packaging structure according to claim 1, wherein a material of the sealant layer is an ultraviolet curable resin adhesive or a thermosetting resin adhesive.

9. The OLED packaging structure according to claim 1, wherein a material of the filling adhesive layer is an ultraviolet curable resin adhesive or a thermosetting resin adhesive.

10. A display apparatus, comprising the OLED packaging structure according to claim 1 and the display substrate provided with the OLED device.

11. The display apparatus according to claim 10, wherein the reinforcing material is a nanowire.

12. The display apparatus according to claim 11, wherein a volume ratio of the nanowire in the support blocks is 10%-50%.

13. The display apparatus according to claim 10, wherein surfaces of the support blocks in contact with the display substrate are planes.

14. The display apparatus according to claim 10, wherein a width of the sealant layer is greater than a width of the support blocks in the area where the sealant layer is located.

15. The display apparatus according to claim 14, wherein each edge of the first surface of the packaging cover plate is uniformly provided with the plurality of support blocks.

16. The display apparatus according to claim 10, wherein each edge of the first surface of the packaging cover plate is provided with at least one support block.

17. An OLED packaging method, comprising:
    making a plurality of support blocks, and arranging the plurality of support blocks in an area where a sealant layer is to be formed on edges of a first surface of a packaging cover plate;
    coating the sealant layer around the edges of the first surface of the packaging cover plate;
    coating a filling adhesive layer in an area defined by the sealant layer; and
    pressing the packaging cover plate and a surface of a display substrate provided with an OLED device together, and curing the sealant layer and the filling adhesive layer;
    wherein the making the plurality of support blocks comprises:
    doping nanowires in sealant;
    curing the sealant doped with the nanowires; and cutting the sealant doped with the nanowires into the support blocks with a preset thickness, wherein the preset thickness is a thickness between the packaging cover plate and the display substrate.

* * * * *